United States Patent [19]

Spires

[11] Patent Number: 4,510,550
[45] Date of Patent: Apr. 9, 1985

[54] RELAY DRIVER

[75] Inventor: Dewayne A. Spires, Plaistow, N.H.

[73] Assignee: AT&T Bell Laboratories, Murray Hill, N.J.

[21] Appl. No.: 450,376

[22] Filed: Dec. 16, 1982

[51] Int. Cl.³ ............................................ H01H 47/32
[52] U.S. Cl. .................................... 361/152; 330/257; 330/297
[58] Field of Search ................ 361/152; 330/257, 297; 323/312, 315, 316; 307/270

[56] References Cited

U.S. PATENT DOCUMENTS

| | | | |
|---|---|---|---|
| 3,790,862 | 2/1974 | Kampf et al. | 361/152 |
| 4,263,562 | 4/1981 | Seiler | 330/257 |
| 4,380,728 | 4/1983 | Kearney | 361/152 X |

Primary Examiner—Reinhard J. Eisenzopf
Attorney, Agent, or Firm—John K. Mullarney

[57] ABSTRACT

A relay load is connected in the collector path of a first transistor (Q1) of high current carrying capacity. A second transistor (Q2) of similar conductivity type is effectively coupled across the first transistor. The bases of said first and second transistors are connected together. A current mirror circuit (Q3–Q6) is coupled from the collector of said second transistor to said bases to provide the additional base drive necessary to drive the first transistor towards saturation regardless of its Beta when maximum load current is required. The mirror circuit is designed so that the effects of transistor $V_{be}$ mismatches in the mirror are minimized.

6 Claims, 2 Drawing Figures

RELAY DRIVER

TECHNICAL FIELD

The present invention relates to a relay driver that minimizes power dissipation in the driver circuit while maintaining a maximum drive voltage to the relay load for relays having substantially different operate currents (e.g., 5 mA to 250 mA).

BACKGROUND OF THE INVENTION

The traditional prior art relay driver consists of a single transistor with the relay load connected to the collector. The base drive current is tailored to a particular relay as a function of its maximum operate current and the minimum transistor Beta. However, if such a driver is required to be flexible and function with relays which have different operate currents, the base drive must be calculated for the relay having the largest operate current. Therefore, power is wasted when the driver is used with relays having smaller operate currents. For example, assuming a minimum Beta of 30, if one relay requires 250 mA to operate the base drive must be 8.3 mA, of which over 8 mA is wasted to drive a 5 mA relay.

One solution to this problem is to increase the effective Beta of the transistor driver by using a Darlington configuration. If the effective Beta can be increased to 500, then only 0.5 mA of base drive is necessary for either relay in the previous example. This minimizes the quiescent current drain, but because of the Darlington stage the voltage available to drive the relay will be additionally reduced by a $V_{be}$. In certain applications this may be acceptable, but with a low voltage relay supply (e.g., 5 V) an additional reduction of a $V_{be}$ is such a significant degradation that a 5 volt relay may not operate under worst case conditions. Also, if the relay winding could be redesigned to operate at this lower voltage it would necessitate a higher relay operate current, and thus a further increase in power.

SUMMARY OF THE INVENTION

A relay driver circuit in accordance with the present invention uses a single output transistor (Q1) to avoid the drawback of a Darlington configured stage. The output transistor (Q1) is made large enough (of high current carrying capacity) to handle a maximum load current (e.g., 250 mA). However, in this driver the base drive current of Q1 ($I_D$) is automatically adjusted depending on the load current to minimize the quiescent current drain. Hence, if the load current is small (e.g. 5 mA) $I_D$ is quite small, but if the load current is large (e.g., 250 mA), the drive current $I_D$ is large enough to saturate Q1. The circuit also compensates for Beta variations due to temperature and integrated circuit processing variations so that power is not wasted when Betas are high and small drive currents will suffice. This avoids the problem of having to design the base drive current for the drive transistor Q1 based on minimum Betas and thus wasting that current in most applications.

In a preferred embodiment of the present invention the relay load is connected in the collector path of a first transistor (of high current carrying capacity). A second transistor of similar conductivity type is effectively coupled across the first transistor. The bases of said first and second transistors are connected together. A current mirror circuit is coupled from the collector of said second transistor to said bases to provide the additional base drive necessary to drive the first transistor towards saturation regardless of its Beta when maximum load current is required.

It is an advantageous feature of the invention that the effects of $V_{be}$ mismatches in the current mirror circuit are substantially minimized.

BRIEF DESCRIPTION OF THE DRAWING

The invention will be more fully appreciated from the following detailed description when the same is considered in connection with the accompanying drawings, in which.

DETAILED DESCRIPTION

Figure 1:
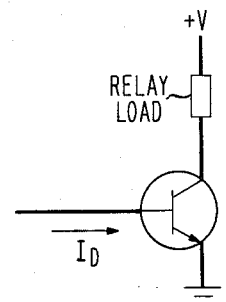
FIG. 1 is a schematic diagram of a typical prior art relay driver.

As shown in FIG. 1, the traditional prior art relay driver circuit consists of a single transistor with the relay load connected in the collector path.

Figure 2:
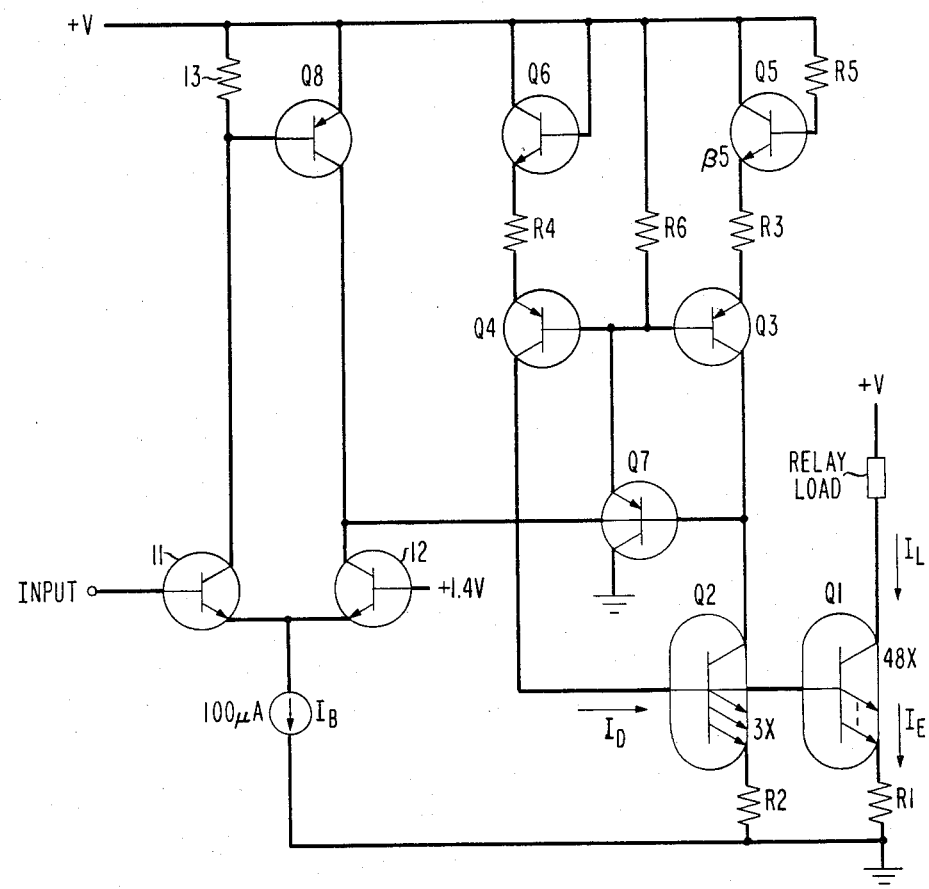
FIG. 2 is a schematic circuit diagram of a relay driver circuit constructed in accordance with the principles of the present invention.

The improved relay driver circuit in accordance with the invention is shown in FIG. 2 of the drawings. An input enabling signal is delivered to the input stage, which is a differential stage comprised of transistors 11 and 12. The collector of transistor 11 is connected to a source of reference potential (e.g., +5 V) via resistance 13 and the collector of transistor 12 is connected to said source via transistor Q8. The resistance 13 is across the base-emitter of Q8. A constant current source $I_B$ (e.g., 100 μA) is connected in the emitter paths of transistors 11 and 12. The output of this input stage is delivered to the current mirror circuit comprised of transistors Q3, Q4, Q5 and Q6.

The current mirror circuit is coupled between the collector of transistor Q2 and the bases of transistors Q1 and Q2. The relay load is connected in the collector path of the output drive transistor Q1. The transistor Q1 bears the designation 48× which, as is known to those in the art, is understood to mean that it has an enlarged emitter area (forty eight times) to achieve a corresponding increase in current carrying capacity. The transistor Q2 is of a similar conductivity type (n-p-n) and is effectively coupled across the transistor Q1. The bases of transistors Q1 and Q2 are connected together. The emitter of Q2 is scaled by a factor of three (3×) to achieve a corresponding increase in its current carrying capacity. It is to be understood, however, that the invention is in no way limited to the indicated scaling factors (3× for Q2 and 48× for Q1). The emitters of transistors Q1 and Q2 are connected to ground by the resistances R1 and R2, respectively. For reasons which will be explained hereinafter, the resistances R1 and R2 are chosen to have a ratio of approximately 1/100 (e.g., R1=1 ohm; R2=100 ohms).

The transistors Q3 and Q5 have their emitter-collector paths connected in series, with the collector of Q3 connected to the collector of Q2. The transistors Q4 and Q6 also have their emitter-collector paths connected in series, with the collector of Q4 connected to the bases of Q1 and Q2. The transistor Q3 is of the same conductivity type as transistor Q4, and transistor Q5 is of the same conductivity type as transistor Q6. The transistors Q4 and Q6 are chosen to match the transistors Q3 and Q5, respectively. The $V_{be}$ of transistor Q4, for example, equals the $V_{be}$ of Q3 and therefore Q4 "mirrors" the current flow in the emitter-collector path of Q3; the $V_{be}$ is the voltage drop across the base-emitter junction. The current mirror is fairly accurate, but a high degree of precision is not required. The resistances R3 and R4 (e.g., 100 ohms) serve to substantially minimize the effect of $V_{be}$ mismatches in the mirror circuit. The resistance R6 insures that leakage currents do not create an output current when the mirror is supposed to be biased off. The transistor Q7 is a helper transistor; i.e., it serves to reduce any possible error that might be introduced by the base currents of Q3 and Q4 and current through resistance R6 in affecting the desired action of the mirror circuit. The resistance R5 is connected between the base and collector of transistor Q5 and has a Beta compensation purpose, which will be appreciated hereinafter.

The driver is turned ON by holding the INPUT low (e.g., below 1.4 volts). This turns off transistor 11, turns on transistor 12 and thereby routes the 100 μA bias current ($I_B$) into the current mirror circuit. Assuming for present purposes no Beta compensation, the base drive current of transistor Q1 ($I_D$) will now be 100 μA. This begins to turn on the output transistor Q1. Transistors Q1 and Q2 with their respective emitter resistances R1 and R2 comprise another current mirror such that the collector current of Q2 is a measure of the emitter current in Q1. Therefore, when Q1 is not saturated the collector current of Q2 also meters the collector current of Q1, and hence the load current ($I_L$).

For small load currents (less than 5 mA) the ratio of the collector current of Q2 is approximately 1/16 the load current, based on the emitter scaling of Q2 to Q1. For large loads (greater than 200 mA) this ratio approaches 1/100, the value of R1/R2. For intermediate load currents (e.g., 50 mA) this ratio is approximately 1/60. The collector current of Q2 connects to the current mirror circuit in parallel with the 100 μA bias current. This creates a positive feedback effect and increases $I_D$ to drive Q1 towards saturation. This positive feedback will saturate Q1 providing its Beta is greater than 100. Betas less than 100 are compensated for by R5 and Q5 in the current mirror. The emitter current in Q5 is the same as the collector current of Q2 which causes the base current of Q5 to be the collector current of Q2 divided by the Beta of Q5. This latter current times the resistance of R5 (e.g., 14K) creates a voltage that effectively appears across resistance R4. The increased voltage drop across R4 necessitates an increased current flow through the emitter-collector path of Q6 and as a consequence increases the current $I_D$. The amount of this increase is the collector current of Q2 divided by the Beta of Q5 times R5/R4. Referenced to the emitter current of Q1 then, the total base drive current $I_D$ is given by the equation:

$$I_D \approx I_B + I_E\left[\frac{R1}{R2} + \frac{1}{\beta_5}\frac{(R1)(R5)}{(R2)(R4)}\right],$$

which reduces to:

$$I_D \approx 100\mu A + \frac{I_E}{100} + \frac{1.41 I_E}{\beta_5},$$

where $\beta_5$ is the Beta of Q5. Therefore, assuming that the Betas of Q1 and Q5 are relatively well matched, enough base drive is always available to saturate Q1 regardless of its Beta. When Q1 saturates, any additional base drive supplied by $I_D$ flows through its forward biased collector base junction. The positive feedback cannot force $I_D$ to increase without bound because the low input impedance of saturated Q1 shunts Q2 so that the loop gain drops to well below one (1).

The driver circuit is turned OFF by pulling the INPUT high. This saturates the transistor Q8 which "robs" all input current to the mirror, thus reducing $I_D$ to zero. In the OFF state the current drain for the entire driver is only 100 μA.

The transistor types shown in the schematic drawing are merely by way of illustration, it being clear to those in the art that p-n-p transistors can generally be substituted for n-p-n transistors and vice versa with due regard, of course, to the polarities of the reference source(s). Further, the driver circuit in accordance with the invention can be readily fabricated in intergrated circuit form. It is to be understood, therefore, that the foregoing disclosure results to only a preferred embodiment of the invention and that numerous modifications or alterations may be made therein without departing from the spirit and scope of the invention.

What is claimed is:

1. A relay driver circuit comprising a first transistor (Q1) having a relay load connected in its collector path, a second transistor (Q2) of similar conductivity type being coupled across the first transistor, the bases of said first and second transistors being connected together, and current mirror means (Q3–Q6) coupled from the collector of said second transistor to said bases to provide the additional base drive necessary to drive the first transistor towards saturation regardless of its Beta when maximum load current is required.

2. A relay driver circuit as defined in claim 1 wherein the emitter of said first transistor has a substantially enlarged emitter area to achieve a substantial increase in current carrying capacity.

3. A relay driver circuit as defined in claim 1 wherein said current mirror means includes means (R3, R4) to substantially minimize the effects of $V_{be}$ mismatches in said mirror means.

4. A relay driver circuit as defined in claim 3 wherein said current mirror means includes means (R5, Q5, Q6) for compensating for Beta variations of the first transistor.

5. A relay driver circuit as defined in claim 4 including first (R1) and second (R2) resistances respectively connected in the emitter paths of said first and second transistors, said first and second resistance values bearing a predetermined ratio.

6. A relay driver circuit as defined in claim 5 wherein said first and second transistors with their respective emitter resistances comprise another current mirror.

* * * * *